United States Patent
Toshima et al.

(10) Patent No.: US 10,084,124 B2
(45) Date of Patent: Sep. 25, 2018

(54) THERMOELECTRIC CONVERSION MATERIAL-CONTAINING RESIN COMPOSITION AND FILM FORMED FROM THERMOELECTRIC CONVERSION MATERIAL-CONTAINING RESIN COMPOSITION

(71) Applicant: ZEON CORPORATION, Chiyoda-ku, Tokyo (JP)

(72) Inventors: Naoki Toshima, Tokyo (JP); Keisuke Oshima, Tokyo (JP); Yosuke Ohkawachi, Tokyo (JP); Shoko Ichikawa, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/122,467

(22) PCT Filed: Mar. 4, 2015

(86) PCT No.: PCT/JP2015/056400
§ 371 (c)(1),
(2) Date: Aug. 30, 2016

(87) PCT Pub. No.: WO2015/133536
PCT Pub. Date: Sep. 11, 2015

(65) Prior Publication Data
US 2017/0069812 A1    Mar. 9, 2017

(30) Foreign Application Priority Data
Mar. 7, 2014    (JP) ................. 2014-045238

(51) Int. Cl.
| | | |
|---|---|---|
| *H01L 35/14* | (2006.01) | |
| *B82Y 30/00* | (2011.01) | |
| *C08K 7/06* | (2006.01) | |
| *C08L 101/00* | (2006.01) | |
| *H01L 35/22* | (2006.01) | |
| *H01L 35/24* | (2006.01) | |
| *H01L 35/34* | (2006.01) | |
| *C08K 7/22* | (2006.01) | |
| *C08J 5/18* | (2006.01) | |
| *C08K 3/04* | (2006.01) | |
| *H01L 35/02* | (2006.01) | |

(52) U.S. Cl.
CPC .............. *H01L 35/14* (2013.01); *B82Y 30/00* (2013.01); *C08J 5/18* (2013.01); *C08K 3/04* (2013.01); *C08K 7/06* (2013.01); *C08K 7/22* (2013.01); *C08L 101/00* (2013.01); *H01L 35/02* (2013.01); *H01L 35/22* (2013.01); *H01L 35/24* (2013.01); *H01L 35/34* (2013.01); *C08J 2327/06* (2013.01); *C08J 2379/08* (2013.01)

(58) Field of Classification Search
CPC ......... H01L 35/14; H01L 35/22; H01L 35/24; H01L 35/02; H01L 35/34
See application file for complete search history.

(56) References Cited

U.S. PATENT DOCUMENTS

| | | | | | |
|---|---|---|---|---|---|
| 2010/0319750 | A1* | 12/2010 | Meng | ............ | B82Y 30/00 136/239 |
| 2012/0018682 | A1* | 1/2012 | Minami | ............ | H01L 35/26 252/514 |
| 2013/0333738 | A1* | 12/2013 | Suemori | ............ | H01L 35/32 136/207 |

FOREIGN PATENT DOCUMENTS

| | | |
|---|---|---|
| JP | 2006128444 A | 5/2006 |
| JP | 2014029932 A | 2/2014 |

OTHER PUBLICATIONS

"Organic Thermoelectric Materials and Devices Based on p- and n-Type Poly(metal 1,1,2,2-ethenetetrathiolate)s", Yimeng Sun, Peng Sheng, Chongan Di, Fei Jiao, Wei Xu, Dong Qiu, and Daoben Zhu, Advanced Materials, 2012, vol. 24, p. 932-937.
Mar. 31, 2015, International Search Report issued in the International Patent Application No. PCT/JP2015/056400.
Sep. 13, 2016, International Preliminary Report on Patentability issued in the International Patent Application No. PCT/JP2015/056400.
Naoki Toshima et al., "Novel Hybrid Organic Thermoelectric Materials: Three-Component Hybrid Films Consisting of a Nanoparticle Polymer Complex, Carbon Nanotubes, and Vinyl Polymer" Advanced Materials, Feb. 16, 2015, pp. 2246-2251, vol. 27, No. 13.
Oct. 11, 2017, Extended European Search Report issued by the European Patent Office in the corresponding European Patent Application No. 15757929.3.

* cited by examiner

*Primary Examiner* — Golam Mowla
(74) *Attorney, Agent, or Firm* — Kenja IP Law PC

(57) ABSTRACT

Provided are a resin composition that enables simple formation of a film having excellent thermoelectric conversion characteristics and flexibility, and a film that is formed using the resin composition and that has excellent thermoelectric conversion characteristics and flexibility. A thermoelectric conversion material-containing resin composition contains (A) an insulating resin, (B) an inorganic thermoelectric conversion material, and (C) a charge transport material. A film is formed according to a commonly known method using the thermoelectric conversion material-containing resin composition. It is preferable that (B) the inorganic thermoelectric conversion material is in the form of fine tubes or fine wires. Single-walled carbon nanotubes are particularly preferable as (B) the inorganic thermoelectric conversion material.

13 Claims, No Drawings

THERMOELECTRIC CONVERSION MATERIAL-CONTAINING RESIN COMPOSITION AND FILM FORMED FROM THERMOELECTRIC CONVERSION MATERIAL-CONTAINING RESIN COMPOSITION

TECHNICAL FIELD

The present disclosure relates to a thermoelectric conversion material-containing resin composition and a film formed from the thermoelectric conversion material-containing resin composition.

BACKGROUND

In recent years, there has been much interest in thermoelectric conversion materials that can directly convert thermal energy to electrical energy. Furthermore, there is demand for flexible film-shaped thermoelectric conversion materials in order to form light-weight and large-area elements and to form elements that can easily be incorporated into various devices without any restrictions in terms of shape.

Conventionally, inorganic materials have mainly been investigated as thermoelectric conversion materials, however, in order to meet the demand described above, organic materials have been more actively investigated for use as thermoelectric conversion materials in recent years. The reason for this is that organic materials typically have excellent processability and flexibility compared to inorganic materials.

One example of a known organic thermoelectric conversion material is a poly(metal 1,1,2,2-ethenetetrathiolate) (refer to NPL 1).

CITATION LIST

Non-Patent Literature
  NPL 1: "Organic thermoelectric materials and devices based on p- and n-type poly(metal 1,1,2,2-ethenetetrathiolate)s"; Yimeng Sun, Peng Sheng, Chongan Di, Fei Jiao, Wei Xu, Dong Qiu, and Daoben Zhu; Advanced Materials; 2012; vol. 24; p. 932-937

SUMMARY (Technical Problem)
  However, the poly(metal 1,1,2,2-ethenetetrathiolate)s described in NPL 1 have poor film forming properties, making it difficult to form a film having excellent flexibility. Furthermore, when application in a thermoelectric conversion element is considered, further improvement in electrical conductivity of these poly(metal 1,1,2,2-ethenetetrathiolate)s is desirable.

The present disclosure is made in light of the problems described above and an objective thereof is to provide a resin composition that enables simple formation of a film having excellent thermoelectric conversion characteristics and flexibility, and to provide a film that is formed using the resin composition and that has excellent thermoelectric conversion characteristics and flexibility.
(Solution to Problem)
  The present inventors discovered that the problems described above can be solved through a thermoelectric conversion material-containing resin composition that contains (A) an insulating resin, (B) an inorganic thermoelectric conversion material, and (C) a charge transport material, and this discovery led to the present disclosure. More specifically, the present disclosure provides the following.

(1) A thermoelectric conversion material-containing resin composition comprising: (A) an insulating resin; (B) an inorganic thermoelectric conversion material; and (C) a charge transport material.

(2) The thermoelectric conversion material-containing resin composition described in (1), wherein (B) the inorganic thermoelectric conversion material is in the form of tubes or wires having an average diameter of from 0.5 nm to 3,000 nm and an aspect ratio, representing a ratio of average length relative to the average diameter, of at least 10.

(3) The thermoelectric conversion material-containing resin composition described in (2), wherein (B) the inorganic thermoelectric conversion material is single-walled carbon nanotubes.

(4) The thermoelectric conversion material-containing resin composition described in any one of (1) to (3), wherein (A) the insulating resin is at least one selected from the group consisting of a polyolefin and a halogenated polyolefin.

(5) The thermoelectric conversion material-containing resin composition described in (4), wherein (A) the insulating resin is polyvinyl chloride.

(6) A film formable using the thermoelectric conversion material-containing resin composition described in any one of (1) to (5).

(7) A thermoelectric conversion element comprising the film described in (6).
(Advantageous Effect)
  According to the present disclosure, it is possible to provide a resin composition that enables simple formation of a film having excellent thermoelectric conversion characteristics and flexibility, and to provide a film that is formed using the resin composition and that has excellent thermoelectric conversion characteristics and flexibility.

DETAILED DESCRIPTION

<<Thermoelectric Conversion Material-Containing Resin Composition>>
  A presently disclosed thermoelectric conversion material-containing resin composition (hereinafter, also referred to simply as a resin composition) contains (A) an insulating resin, (B) an inorganic thermoelectric conversion material, and (C) a charge transport material. The resin composition may be a liquid-form composition that further contains (S) an organic solvent. Besides (A) the insulating resin, (B) the inorganic thermoelectric conversion material, (C) the charge transport material, and (S) the organic solvent, the resin composition may further contain, as (D) other components, reinforcing materials, fillers, and additives that are conventionally contained in various resin compositions.

The following describes essential components and optional components contained in the resin composition.
  <(A) Insulating Resin>
  No specific limitations are placed on (A) the insulating resin other than being formable into the shape of a film and (A) the insulating resin can be selected as appropriate from among insulating resins that are conventionally used for the purpose of film formation. So long as (A) the insulating resin would normally be recognized by a person in the technical field as being an insulating material, no specific limitations are placed thereon. The electrical conductivity of (A) the insulating resin is preferably no greater than 1 S/cm. Moreover, the thermal conductivity of (A) the insulating resin is preferably no greater than 0.5 W/mK, and more preferably no greater than 0.3 W/mK.

Suitable examples of (A) the insulating resin include polyolefins such as polypropylene, high-density polyethylene, low-density polyethylene, linear low-density polyethylene, cross-linked polyethylene, ultra-high molecular weight polyethylene, polybutene-1, poly-3-methylpentene, poly-4-methylpentene, ethylene-vinyl acetate copolymer, ethylene-ethyl acrylate copolymer, ethylene-propylene copolymer, and a copolymer of polyethylene and a cyclo-olefin such as norbornene; halogenated polyolefins such as polyvinyl chloride, polyvinylidene chloride, chlorinated polyethylene, chlorinated polypropylene, polyvinylidene fluoride, chlorinated rubber, vinyl chloride-vinyl acetate copolymer, vinyl chloride-ethylene copolymer, vinyl chloride-vinylidene chloride copolymer, vinyl chloride-vinylidene chloride-vinyl acetate terpolymer, vinyl chloride-acrylic acid ester copolymer, vinyl chloride-maleic acid ester copolymer, and vinyl chloride-cyclohexylmaleimide copolymer; petroleum resin; coumarone resin; polystyrene; polyvinyl acetate; acrylic resins such as polymethyl methacrylate; polyacrylonitrile; styrene-based resins such as AS resin, ABS resin, ACS resin, SBS resin, MBS resin, and heat-resistant ABS resin; polyvinyl alcohol; polyvinyl formal; polyvinyl butyral; polyalkylene terephthalates such as polyethylene terephthalate, polytrimethylene terephthalate, polybutylene terephthalate, and polycyclohexanedimethylene terephthalate; polyalkylene naphthalates such as polyethylene naphthalate and polybutylene naphthalate; liquid-crystal polyester (LCP); degradable aliphatic polyesters such as polyhydroxybutyrate, polycaprolactone, polybutylene succinate, polyethylene succinate, polylactic acid, polymalic acid, polyglycolic acid, polydioxane, and poly(2-oxetanone); polyphenylene oxide; nylon resins such as nylon 6, nylon 11, nylon 12, nylon 6,6, nylon 6,10, nylon 6T, nylon 61, nylon 9T, nylon MST, nylon 6,12, nylon MXD6, para-aramids, and meta-aramids; polycarbonate resin; polyacetal resin; polyphenylene sulfide; polyurethane; polyimide resin; polyamide imide resin; polyether ketone resin; and polyether ether ketone resin. Any two or more of such resins may be used in combination.

Among the resins listed above as examples, polyolefins and halogenated polyolefins are preferable in terms of film forming properties of the resin composition, and polyvinyl chloride is particularly preferable.

No specific limitations are placed on the content of (A) the insulating resin in the resin composition so long as the content is within a range that does not interfere with the objective of the present disclosure. The content of (A) the insulating resin in the resin composition, expressed as a ratio of the mass of (A) the insulating resin relative to the total mass of components other than (S) the organic solvent in the resin composition, is preferably from 1 mass % to 80 mass %, and more preferably from 10 mass % to 30 mass %.

<(B) Inorganic Thermoelectric Conversion Material>

So long as (B) the inorganic thermoelectric conversion material would be conventionally recognized by a person in the technical field as an inorganic material having thermoelectric conversion capability, no specific limitations are placed thereon. Specific examples of such materials include single-walled carbon nanotubes; metal oxides and sulfides such as zinc oxide, tin oxide, strontium titanate, barium titanate, (Zn,Al)O, NaCo$_2$O$_4$, Ca$_3$Co$_4$O$_9$, Bi$_2$Sr$_2$Co$_2$O$_y$, and silver sulfide; and metal element composite materials containing at least two elements selected from Bi, Sb, Ag, Pb, Ge, Cu, Sn, As, Se, Te, Fe, Mn, Co, and Si. Examples of suitable metal element composite materials include materials based on BiTe, BiSb, BiSbTe, BiSbSe, CoSb, PbTe, TeSe, and SiGe, and magnesium silicide-based materials (Mg$_2$Si-based materials).

No specific limitations are placed on the form of (B) the inorganic thermoelectric conversion material so long as (B) the inorganic thermoelectric conversion material can be favorably dispersed in (A) the insulating resin. It is preferable that (B) the inorganic thermoelectric conversion material is particle-shaped, tube-shaped, or wire-shaped, with tube-shaped or wire-shaped being more preferable. In a situation in which (B) the inorganic thermoelectric conversion material is tube-shaped or wire-shaped, it is easy to achieve point-contact in a film formed from the resin composition. Therefore, carriers (charge) in the film tend to have high mobility in a situation in which (B) the inorganic thermoelectric conversion material is tube-shaped or wire-shaped.

In a situation in which the inorganic thermoelectric conversion material is particle-shaped, the average particle diameter of the inorganic thermoelectric conversion material is preferably from 2 nm to 100 μm, and more preferably from 2 nm to 10 μm. In a situation in which the inorganic thermoelectric conversion material is tube-shaped or wire-shaped, the average diameter (average length in a minor axis direction) of the tubes or wires is preferably from 0.5 nm to 3,000 nm, and more preferably from 0.5 nm to 2,000 nm. The aspect ratio (average length/average diameter; note that the "average length" refers to the average length in a major axis direction) of the tubes or wires is preferably at least 10, and more preferably from 10 to 2,000. The average particle diameter, average length, and average diameter described above are number average values obtained from an electron microscope image of the inorganic thermoelectric conversion material.

No specific limitations are placed on the content of (B) the inorganic thermoelectric conversion material in the resin composition so long as the content is within a range that does not interfere with the objective of the present disclosure. The content of (B) the inorganic thermoelectric conversion material in the resin composition, expressed as a ratio of the mass of (B) the inorganic thermoelectric conversion material relative to the total mass of components other than (S) the organic solvent in the resin composition, is preferably from 4 mass % to 70 mass %, and more preferably from 10 mass % to 40 mass %.

<(C) Charge Transport Material>

(C) The charge transport material is a substance that transports electrons or holes, or promotes transport thereof, and that increases thermoelectric conversion efficiency of a film formed using the resin composition. The electrical conductivity and the power factor of the film formed using the resin composition are increased as a result of the resin composition containing (C) the charge transport material.

Various substances that are used in order to promote transport of electrons or holes for various purposes can be used as (C) the charge transport material. For example, a charge transport material that is used as a constituent material of an organic electroluminescence element, a constituent material of a photoelectric conversion element, or a constituent material of a photosensitive layer in an electrophotographic photoreceptor of an electrophotographic device is suitable for use as (C) the charge transport material.

Preferable examples of (C) the charge transport material include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene; 4-N,N-diphenylamino-(2-diphenylvinyl)benzene; aromatic amine compounds such as 3-methoxy-4'-N,N-diphenylamino stilbene, N-phenylcarbazole, 4,4'-bis[N-(1-naphthyl)-N-phenylamino]biphenyl (NPD), and 4,4',4"-tris[N-(3-methylphenyl)-N-phenylamino]triphenylamine (MTDATA); condensed polycyclic aromatic compounds such as anthracene, tetracene, pentacene, hexacene, heptacene, chrysene, picene, fulminene, pyrene, peropyrene, perylene, terrylene, quaterrylene, coronene, ovalene, circumanthracene, bisanthene, zethrene, heptazethrene, pyranthrene, violanthrene, isoviolanthrene, circobiphenyl, anthradithiophene, and derivatives thereof; conjugated compounds such as tetrathiafulvalene compounds, quinone compounds, and cyano compounds such as tetracyanoquinodimethane; and complexessuch as a tetrathiafulvalene-tetracyanoquinodimethane complex, and a dodecyltrimethylammonium salt, tetramethylammonium salt, tetradimethylammoniopropanesulfonate salt, or the like of a poly(metal 1,1,2,2-ethenetetrathiolate) such as poly(nickel 1,1,2,2-ethenetetrathiolate). Any two or more of such materials may be used in combination as (C) the charge transport material.

Among the specific examples of (C) the charge transport material listed above, at least one selected from the group consisting of tetrathiafulvalene, a tetrathiafulvalene-tetracyanoquinodimethane complex, and a dodecyltrimethylammonium salt, tetramethylammonium salt, or tetradimethylammoniopropanesulfonate salt of poly(nickel 1,1,2,2-ethenetetrathiolate) is preferable in terms that a resin composition that enables formation of a film having excellent thermoelectric conversion characteristics can be easily obtained.

No specific limitations are placed on the content of (C) the charge transport material in the resin composition so long as the content is within a range that does not interfere with the objective of the present disclosure. The content of (C) the charge transport material in the resin composition, expressed as a ratio of the mass of (C) the charge transport material relative to the total mass of components other than (S) the organic solvent in the resin composition, is preferably from 15 mass % to 95 mass %, and more preferably from 30 mass % to 70 mass %.

<(S) Organic Solvent>

The resin composition may contain (S) the organic solvent in a situation in which the resin composition is to be used to form a cast film. No specific limitations are placed on the type of (S) the organic solvent other than enabling homogenous dissolution of (A) the insulating resin. Therefore, the type of (S) the organic solvent is selected as appropriate depending on the type of (A) the insulating resin. Note that it is not essential that (B) the inorganic thermoelectric conversion material and (C) the charge transport material are soluble in (S) the organic solvent.

Suitable examples of (S) the organic solvent include aromatic solvents such as toluene, xylene, ethylbenzene, anisole, trimethylbenzene, p-fluorophenol, p-chlorophenol, o-chlorophenol, and perfluorophenol; ethers such as tetrahydrofuran, dioxane, cyclopentyl monomethyl ether, ethylene glycol monoethyl ether, ethylene glycol monomethyl ether acetate, ethylene glycol monoethyl ether acetate, propylene glycol monomethyl ether acetate, diethylene glycol monobutyl ether acetate, diethylene glycol monoethyl ether acetate, and 3-methoxybutyl acetate; ketones such as cyclohexanone, methyl isobutyl ketone, methyl ethyl ketone, and diisobutyl ketone; nitrogen-containing polar organic solvents such as N,N-dimethylformamide, N,N-dimethylacetamide, N,N-diethylformamide, 2-pyrrolidone, N-methyl-2-pyrrolidone, N-ethyl-2-pyrrolidone, 1,3-dimethyl-2-imidazolidinone, N,N,N,N-tetramethylurea, N-methyl-ε-caprolactum, and hexamethylphosphoric triamide; and esters such as ethyl acetate, methyl acetate, n-propyl acetate, isopropyl acetate, n-butyl acetate, n-pentyl acetate, methyl lactate, ethyl lactate, n-butyl lactate, γ-butyrolactone, and γ-valerolactone. Any two or more of such examples may be used in combination as (S) the organic solvent.

In a situation in which the resin composition contains (S) the organic solvent, the content of components other than (S) the organic solvent in the resin composition relative to the total mass of the resin composition is preferably from 0.1 mass % to 50 mass %, more preferably from 0.1 mass % to 30 mass %, and particularly preferably from 0.1 mass % to 20 mass %.

<(D) Other Components>

The resin composition may contain one or more components selected from reinforcing materials, fillers, and various additives that are conventionally contained in various resin compositions used for a wide range of purposes. Specific examples of such additives include plasticizers, dispersants, colorants, ultraviolet absorbers, antioxidants, nucleating agents, and flame retardants. The amounts of the reinforcing materials, fillers, and additives that are used are selected as appropriate within the ranges of amounts of these reinforcing materials, fillers, and additives in conventional resin compositions, while taking into account film forming properties during film formation and so forth.

<<Resin Composition Production Method>>

No specific limitations are placed on the method by which the resin composition is produced other than being a method that enables homogenous mixing of the components described above. In a situation in which the resin composition does not contain (S) the organic solvent, the resin composition can be obtained by homogenously mixing (A) the insulating resin and components other than (A) the insulating resin using a melt-kneading apparatus such as a two-roll mill, a three-roll mill, a pressure kneader, a Banbury mixer, a single-screw extruder, or a twin-screw extruder.

In a situation in which the resin composition contains (S) the organic solvent, the resin composition can be obtained by homogenously mixing or dissolving, in the organic solvent using an ultrasonic homogenizer or the like, the prescribed components other than (S) the organic solvent that are contained in the resin composition. In this situation, (S) the organic solvent may be heated during mixing or dissolving of the components in (S) the organic solvent so long as the temperature is kept within a range that does not cause excessive volatilization of (S) the organic solvent or thermal decomposition of the components.

<<Film Formation Method>>

No specific limitations are placed on the method by which a film is formed using the resin composition described above. The method by which the film is produced can be selected as appropriate from commonly known methods depending on the properties of the resin composition, the type of resin contained in the resin composition, and so forth.

In a situation in which the resin composition is a solid composition that does not contain (S) the organic solvent, the film can be formed according to a commonly known method. Examples of suitable film formation methods include an inflation method, a T-die method, and a calendering method.

In a situation in which the resin composition is a liquid-form composition containing (S) the organic solvent, a film of the resin composition can be formed by applying or casting the liquid-form resin composition onto a substrate and removing (S) the organic solvent from the film of the resin composition that is formed on the substrate. No specific limitations are placed on the method by which (S) the organic solvent is removed from the applied film of the resin composition and examples of methods that can be used include a method in which the applied film is heated and a method in which the applied film is placed in a reduced pressure atmosphere at room temperature or under heating.

Although no specific limitations are placed on the thickness of the film formed by the method described above, the thickness is preferably from 0.1 µm to 10 mm, and more preferably from 1 µm to 3 mm.

Furthermore, the film formed by the method described above is preferably subjected to treatment in which the film is brought into contact with a specific type of treatment liquid described below. The treatment liquid is preferably an organic solvent, a saccharide aqueous solution, an acid-containing aqueous solution, or a base-containing aqueous solution. Electrical conductivity of the film can be improved as a result of subjecting the film to the aforementioned treatment. In this contacting treatment, the treatment liquid is selected so as not to cause swelling or degradation of the film. No specific limitations are placed on the method by which the film and the treatment liquid are brought into contact and examples of methods that can be used include a method in which the treatment liquid is applied onto the film and a method in which the film is immersed in the treatment liquid.

Examples of suitable organic solvents that can be used as the treatment liquid in the contacting treatment include aliphatic alcohols such as methanol, ethanol, n-propanol, isopropanol, n-butanol, n-pentanol, n-hexanol, ethylene glycol, propylene glycol, diethylene glycol, and glycerin; aromatic solvents such as toluene, xylene, and ethylbenzene; and ethers such as diethyl ether, di-n-propyl ether, dioxane, and tetrahydrofuran. Examples of suitable aqueous solutions that can be used include aqueous solutions containing saccharides such as glucose and xylitol, aqueous solutions containing acids such as hydrochloric acid and sulfuric acid, and aqueous solutions containing bases.

A film formed according to the method described above using the resin composition described above has excellent thermoelectric conversion characteristics and flexibility. Therefore, the film is suitable for use as a constituent component of a thermoelectric conversion element.

EXAMPLES

The following provides a more detailed explanation of the present disclosure through examples. However, the present disclosure is not limited to these examples.

Preparation Example 1

Preparation of poly(nickel 1,1,2,2-ethenetetrathiolate) (Solubilized PETT)

First, 1 g of 1,3,4,6-tetrathiapentalene-2,5-dione (TPD, reagent, produced by Tokyo Chemical Industry Co., Ltd.), 1.2 g of sodium methoxide (reagent, produced by Wako Pure Chemical Industries, Ltd.), and 6.8 g of dodecyltrimethylammonium bromide (DTAB, reagent, produced by Wako Pure Chemical Industries, Ltd.) were dissolved in 200 mL of methanol. The resultant solution was heated under reflux for 12 hours. Next, 0.63 g of anhydrous nickel(II) chloride (reagent, produced by Wako Pure Chemical Industries, Ltd.) was added to the solution. After addition of the anhydrous nickel(II) chloride, the solution was heated under reflux for a further 12 hours. After the solution had been refluxed for 12 hours, the solution was left for 12 hours at room temperature to produce a precipitate. The resultant black precipitate was collected by suction filtration. The collected precipitate was washed with 2 L of methanol, 2 L of water, and 50 mL of diethyl ether in the stated order, and was subsequently dried to yield solubilized PETT.

The elemental composition of the resultant solubilized PETT was analyzed and was found to be 15.25 mass % of Ni, 0.48 mass % of Na, 38.56 mass % of S, 30.76 mass % of C, 1.49 mass % of N, and 4.38 mass % of H. These results demonstrate that the resultant solubilized PETT contained sodium ions derived from sodium methoxide and dodecyltrimethylammonium ions derived from DTAB.

The solubility of the resultant solubilized PETT with respect to polar organic solvents such as dimethyl sulfoxide and N-methyl-2-pyrrolidone was investigated and it was confirmed that a solution having a concentration of approximately 3 mass % could be prepared using the resultant solubilized PETT and these polar organic solvents.

Preparation Example 2

Preparation of Charge-Transfer Complex (TTF-TCNQ)

First, 1020.87 mg of 7,7,8,8-tetracyanoquinodimethane (TCNQ, reagent, produced by Tokyo Chemical Industry Co., Ltd.) was added to 250 mL of acetonitrile and was stirred for 12 hours at room temperature to obtain an acetonitrile solution of TCNQ. Next, 1021.88 mg of tetrathiafulvalene (TTF, reagent, produced by Tokyo Chemical Industry Co., Ltd.) was added to 60 mg of acetonitrile and was irradiated with ultrasound for 10 minutes at room temperature to obtain an acetonitrile solution of TTF.

The acetonitrile solution of TCNQ and the acetonitrile solution of TTF were mixed and then stirred for 30 minutes at room temperature. The stirring caused production of a black precipitate in the acetonitrile. The precipitate was collected by filtration and was subsequently dried. The dried precipitate was washed with acetonitrile and was then dried under vacuum for 15 hours at 80° C. to yield 1905.50 mg (yield 93.3%) of a charge-transfer complex (TTF-TCNQ).

In the following examples and comparative examples, PVC and PI shown below were used as insulating resins composing component (A).

PVC: Polyvinyl chloride (reagent, produced by Wako Pure Chemical Industries, Ltd.)

PI: Polyimide (Solpit A, produced by Solpit Industries, Ltd.)

In the following examples and comparative examples, B1 and B2 were used as inorganic thermoelectric conversion materials composing component (B).

B1: Single-walled carbon nanotubes (Pure Tubes (product name), produced by Sigma-Aldrich Co. LLC., average length 1 µm, average diameter 1.4 nm)

B2: Single-walled carbon nanotubes (Single-Walled Carbon Nanotubes, average diameter 0.8 nm, produced by Sigma-Aldrich Co. LLC.)

In the following examples and comparative examples, C1 to C3 shown below were used as charge transport materials composing component (C).

C1: PETT obtained in Preparation Example 1
C2: Charge-transfer complex (TTF-TCNQ) obtained in Preparation Example 2
C3: Tetrathiafulvalene (TTF, reagent, produced by Tokyo Chemical Industry Co., Ltd.)

In each of the examples and comparative examples, in a situation in which an obtained film or sheet was subjected to methanol treatment (MeOH treatment), the methanol treatment was carried out according to the following method.

<Methanol Treatment Method>

First, the film or sheet was immersed in methanol for 30 minutes. Next, the film or sheet was pulled out of the methanol and was dried by heating for 15 minutes on a 70° C. hot plate.

A Seebeck Coefficient/Electric Resistance Measurement System ZEM-3 was used to measure the Seebeck coefficient (S), the electrical conductivity ($\sigma$), and the power factor (PF) of a film, sheet, or block obtained in each of the examples and comparative examples at 340 K. The measurement results are shown in Table 1.

For each film or sheet obtained in the examples and comparative examples, it was confirmed whether or not collapse, rupture, tearing, or the like of the obtained film or sheet occurred easily when touched by hand. In a situation in which collapse, rupture, tearing, or the like of the film or sheet easily occurred when touched by hand, film forming properties were evaluated as "poor", and in a situation in which collapse, rupture, tearing, or the like did not easily occur, film forming properties were evaluated as "good". The evaluation results are shown in Table 1.

Comparative Examples 1 and 2

Sheet-shaped B1 purchased as a reagent was cut out to a size of 4 mm×16 mm, was mounted onto a quartz substrate, and thermoelectric properties thereof were measured using the ZEM-3. The film had a thickness of 18 μm.

In Comparative Example 1, the obtained sheet was not subjected to methanol treatment, whereas in Comparative Example 2 the obtained sheet was subjected to methanol treatment.

Comparative Examples 3 and 4

A dispersion liquid was obtained by homogenously mixing component (A) and component (C) with N-methyl-2-pyrrolidone such that the total of the content of component (A) and the content of component (C) in the dispersion liquid was 0.5 mass %. The ratio of the content of component (A) and the content of component (C) was as shown in Table 1. Moreover, the type of component (A) and the type of component (C) were as shown in Table 1. The obtained dispersion liquid was cast onto a quartz substrate and the quartz substrate was subsequently heated to 60° C. for 10 hours to obtain a film of 8 μm in thickness.

In Comparative Example 3, the obtained sheet was not subjected to methanol treatment, whereas in Comparative Example 4 the obtained sheet was subjected to methanol treatment.

Comparative Examples 5-7

A dispersion liquid was obtained by homogenously mixing component (A) and component (B) with N-methyl-2-pyrrolidone such that the total of the content of component (A) and the content of component (B) in the dispersion liquid was 0.5 mass %. The ratio of the content of component (A) and the content of component (B) was as shown in Table 1. Moreover, the type of component (A) and the type of component (B) were as shown in Table 1. The obtained dispersion liquid was cast onto a quartz substrate and the quartz substrate was subsequently heated to 60° C. for 10 hours to obtain a film of 7 μm in thickness.

In each of Comparative Examples 5 and 6, the obtained sheet was not subjected to methanol treatment, whereas in Comparative Example 7, the obtained sheet was subjected to methanol treatment.

Thermal conductivity $\kappa$ (W/mK) of the film obtained in Comparative Example 5 was measured and the dimensionless figure of merit (ZT) was calculated.

In measurement of the thermal conductivity $\kappa$, a differential scanning calorimeter (DSC 204 F1 Phoenix, produced by NETZSCH Japan K.K.) was used to measure the specific heat Cp (J/gK, 25° C.) of the film. A NanoFlash analyzer (LFA 447/2-4/InSb NanoFlash Xe, produced by NETZSCH Japan K.K.) was used to measure the thermal diffusivity $\alpha$ (mm$^2$/S, 25° C.) of the film. The density $\rho$ (g/cm$^3$) of the film was measured by the Archimedean method. The following values were measured.

Cp: 0.88 (J/gK, 25° C.)
$\alpha$: 0.079 (mm$^2$/S, 25° C.)
$\rho$: 0.83 (g/cm$^3$)

The value of $\kappa$ calculated from the measured values shown above according to the following equation was 0.058 (W/mK).

(Equation for Calculating Thermal Conductivity)

$$\kappa = \alpha \times Cp \times \rho$$

The dimensionless figure of merit (ZT) was calculated from the value of $\kappa$ shown above and the values of the Seebeck coefficient (S) and the electrical conductivity ($\sigma$) shown in Table 1 according to the following equation. The value of ZT was calculated to be 0.02 at 70° C.

(Equation for Calculating Dimensionless Figure of Merit)

$$ZT = (S^2 \sigma \times T) \div \kappa \; (T \text{ is the absolute temperature})$$

Comparative Example 8

The charge-transfer complex (TTF-TCNQ, C2) obtained in Preparation Example 2 was pulverized using an agate mortar. After 110.34 mg of the charge-transfer complex (C2) had been loaded into a mold for pellet production, the powder of the charge-transfer complex (C2) was pressed using a pressing machine to obtain a block-shaped pellet of 10 mm×3.0 mm×2.3 mm. Since a pellet was produced in Comparative Example 8, film forming properties were not evaluated.

In Comparative Example 8, the obtained pellet was not subjected to methanol treatment.

Comparative Example 9

A dispersion liquid was obtained by homogenously mixing 4.22 mg of component (B) (single-walled carbon nanotubes, B1) and 5.27 mg of component (C) (TTF, C3) with 2 mL of N,N-dimethylformamide. The obtained dispersion liquid was cast onto a quartz substrate and the quartz substrate was subsequently heated to 80° C. for 2 hours. Next, the quartz substrate was heated to 110° C. for 30 minutes to obtain a film of 6.3 μm in thickness.

In Comparative Example 9, the obtained sheet was not subjected to methanol treatment.

Examples 1-3

A dispersion liquid was obtained by homogenously mixing component (A), component (B), and component (C) with N-methyl-2-pyrrolidone such that the total of the content of component (A), the content of component (B), and the content of component (C) in the dispersion liquid was 0.5 mass %. The ratio of the content of component (A), the content of component (B), and the content of component (C) was as shown in Table 1. Moreover, the type of component (A), the type of component (B), and the type of component (C) were as shown in Table 1. The obtained dispersion liquid was cast onto a quartz substrate and the quartz substrate was subsequently heated to 60° C. for 10 hours to obtain a film of 6.8 μm in thickness.

In Example 1, the obtained sheet was not subjected to methanol treatment, whereas in each of Examples 2 and 3, the obtained sheet was subjected to methanol treatment.

The thermal conductivity κ (W/mK) of the film obtained in Example 1 was measured in the same way as in Comparative Example 5, and the dimensionless figure of merit (ZT) was calculated. As a result, the ZT value of the film obtained in Example 1 was calculated to be 0.31 at 343 K.

Example 3

An applying liquid containing the same concentrations of CNTs, PETT, and resin in NMP as in Example 2 was obtained in the same way as in Example 2 with the exception that PI was used instead of PVC. Film formation and methanol treatment of the obtained film were carried out in the same way as in Example 2 using the obtained applying liquid.

Example 4

A dispersion liquid was obtained by homogenously mixing 1.36 mg of component (A) (PVC), 3.61 mg of component (B) (single-walled carbon nanotubes, B2), and 4.52 mg of component (C) (TTF, C3) with 2 mL of N,N-dimethylformamide. The resultant dispersion liquid was cast onto a quartz substrate and the quartz substrate was subsequently heated to 80° C. for 2 hours. Next, the quartz substrate was heated to 110° C. for 30 minutes to obtain a film of 4.8 μm in thickness.

In Example 4, the obtained film was not subjected to methanol treatment.

Example 5

A dispersion liquid was obtained by homogenously mixing 1.36 mg of component (A) (PVC), 3.61 mg of component (B) (single-walled carbon nanotubes, B1), and 4.52 mg of component (C) (TTF-TCNQ, C2) with 2 mL of N,N-dimethylformamide. The obtained dispersion liquid was cast onto a quartz substrate and the quartz substrate was subsequently heated to 80° C. for 2 hours. Next, the quartz substrate was heated to 110° C. for 30 minutes to obtain a film of 6.7 μm in thickness.

In Example 5, the obtained film was not subjected to methanol treatment.

TABLE 1

| | Composition | | | | Evaluation | | | |
| --- | --- | --- | --- | --- | --- | --- | --- | --- |
| | Component (A) Type/ Mass % | Component (B) Type/ Mass % | Component (C) Type/ Mass % | MeOH treatment | Film forming properties | S [μVK$^{-1}$] | σ [Scm$^{-1}$] | PF [μWm$^{-1}$K$^{-1}$] |
| Comparative Example 1 | — | B1/100 | — | No | Poor | 38 | 682 | 99.4 |
| Comparative Example 2 | — | B1/100 | — | Yes | Poor | 31 | 608 | 57.6 |
| Comparative Example 3 | PVC/23.1 | — | C1/76.9 | No | Good | −33 | 4.4 × 10$^{-3}$ | 4.8 × 10$^{-4}$ |
| Comparative Example 4 | PVC/23.1 | — | C1/76.9 | Yes | Good | −21 | 8.9 × 10$^{-3}$ | 3.9 × 10$^{-4}$ |
| Comparative Example 5 | PVC/61.9 | B1/38.1 | — | No | Good | 32 | 27.6 | 2.8 |
| Comparative Example 6 | PVC/27.3 | B1/72.7 | — | No | Good | 28 | 37.5 | 2.9 |
| Comparative Example 7 | PVC/27.3 | B1/72.7 | — | Yes | Good | 40 | 43.6 | 6.9 |
| Comparative Example 8 | — | — | C2/100 | No | — | −39 | 105.5 | 15.8 |
| Comparative Example 9 | — | B1/44.5 | C3/55.5 | No | Good | 41 | 89.7 | 15.1 |
| Example 1 | PVC/14.3 | B1/38.1 | C1/47.6 | No | Good | 30 | 421 | 40.3 |
| Example 2 | PVC/14.3 | B1/38.1 | C1/47.6 | Yes | Good | 31 | 598 | 57.2 |
| Example 3 | PI/14.3 | B1/38.1 | C1/47.6 | Yes | Good | 34 | 205 | 23.5 |
| Example 4 | PVC/14.3 | B2/38.1 | C3/47.6 | No | Good | 54 | 96.9 | 28.7 |
| Example 5 | PVC/14.3 | B1/38.1 | C2/47.6 | No | Good | 33 | 227.8 | 30.7 |

Comparative Examples 1 and 2 demonstrate that it is not possible to form a film having excellent flexibility when only single-walled carbon nanotubes are used as (B) an inorganic thermoelectric conversion material.

Comparative Examples 3 and 4 demonstrate that it is not possible to form a film having excellent thermoelectric conversion characteristics using a resin composition composed of (A) an insulating resin and (C) a charge transport material even when (C) the charge transport material is a material having thermoelectric conversion capability.

Comparative Examples 5-7 demonstrate that it is not possible to form a film having excellent thermoelectric conversion characteristics using a resin composition composed of (A) an insulating resin and (B) an inorganic thermoelectric conversion material. Moreover, comparison of Comparative Examples 1 and 2 and Comparative Examples 5-7 demonstrates that even when (B) the inorganic thermoelectric conversion material itself has excellent thermoelectric conversion characteristics, dispersion of (B) the inorganic thermoelectric conversion material in a matrix formed by (A) the insulating resin leads to significant loss of thermoelectric conversion characteristics of the film.

Comparative Example 8 demonstrates that it is not possible to form a film having excellent flexibility using only (C) a charge transport material.

Comparative Example 9 demonstrates that it is only possible to form a film having fairly poor thermoelectric conversion characteristics using a composition composed of (B) an inorganic thermoelectric conversion material and (C) a charge transport material.

Examples 1-5 demonstrate that it is possible to form a film having excellent thermoelectric conversion characteristics and flexibility using a resin composition containing (A) an insulating resin, (B) an inorganic thermoelectric conversion material, and (C) a charge transport material.

Comparison of Examples 1 and 2 demonstrates that it is possible to increase the electrical conductivity of a film formed using a resin composition, and in accompaniment increase the power factor (PF) of the film, by subjecting the film to treatment using an organic solvent such as methanol. In other words, Examples 1 and 2 demonstrate that it is possible to improve thermoelectric conversion characteristics of a film formed using a resin composition containing the prescribed components by subjecting the film to treatment using a specific type of treatment liquid.

The invention claimed is:

1. A thermoelectric conversion material-containing resin composition comprising:
   (A) an insulating resin;
   (B) an inorganic thermoelectric conversion material; and
   (C) a charge transport material, wherein
      (C) the charge transport material comprises at least one selected from the group consisting of tetrathiafulvalene, a tetrathiafulvalene-tetracyanoquinodimethane complex, dodecyltrimethylammonium salt of poly(nickel 1,1,2,2-ethenetetrathiolate), tetramethylammonium salt of poly(nickel 1,1,2,2-ethenetetrathiolate), and tetradimethylammoniopropanesulfonate salt of poly(nickel 1,1,2,2-ethenetetrathiolate).

2. The thermoelectric conversion material-containing resin composition of claim 1, wherein
   (B) the inorganic thermoelectric conversion material is in the form of tubes or wires having an average diameter of from 0.5 nm to 3,000 nm and an aspect ratio, representing a ratio of average length relative to the average diameter, of at least 10.

3. The thermoelectric conversion material-containing resin composition of claim 2, wherein
   (B) the inorganic thermoelectric conversion material is single-walled carbon nanotubes.

4. The thermoelectric conversion material-containing resin composition of claim 1, wherein
   (A) the insulating resin is at least one selected from the group consisting of a polyolefin and a halogenated polyolefin.

5. The thermoelectric conversion material-containing resin composition of claim 4, wherein
   (A) the insulating resin is polyvinyl chloride.

6. A film formable using the thermoelectric conversion material-containing resin composition of claim 1.

7. A film obtainable by subjecting the film of claim 6 to treatment in which the film is brought into contact with a treatment liquid selected from the group consisting of an aliphatic alcohol, an aromatic solvent, an ether, a saccharide aqueous solution, an acid-containing aqueous solution, and a base-containing aqueous solution.

8. A thermoelectric conversion element comprising the film of claim 6.

9. The thermoelectric conversion material-containing resin composition of claim 2, wherein
   (A) the insulating resin is at least one selected from the group consisting of a polyolefin and a halogenated polyolefin.

10. A film formable using the thermoelectric conversion material-containing resin composition of claim 9.

11. A film obtainable by subjecting the film of claim 10 to treatment in which the film is brought into contact with a treatment liquid selected from the group consisting of an aliphatic alcohol, an aromatic solvent, an ether, a saccharide aqueous solution, an acid-containing aqueous solution, and a base-containing aqueous solution.

12. A thermoelectric conversion element comprising the film of claim 11.

13. A thermoelectric conversion element comprising the film of claim 10.

* * * * *

UNITED STATES PATENT AND TRADEMARK OFFICE
CERTIFICATE OF CORRECTION

PATENT NO. : 10,084,124 B2
APPLICATION NO. : 15/122467
DATED : September 25, 2018
INVENTOR(S) : Naoki Toshima et al.

Page 1 of 1

It is certified that error appears in the above-identified patent and that said Letters Patent is hereby corrected as shown below:

In the Specification

Column 3, Line 37, please delete "nylon 6I, nylon 9T, nylon MST," and insert --nylon 6I, nylon 9T, nylon M5T,--.

Column 5, Line 24, please delete "complexessuch" and insert --complexes such--.

Column 6, Line 15, please delete "y-butyrolactone" and insert --γ-butyrolactone--.

Column 6, Line 16, please delete "y-valerolactone" and insert --γ-valerolactone--.

Column 10, Line 42, please delete "$ZT = (S^2\sigma \times T) + \kappa$ (T is the absolute temperature)" and insert --$ZT = (S^2 \times \sigma \times T) + \kappa$ (T is the absolute temperature)--.

Signed and Sealed this
Eighth Day of January, 2019

Andrei Iancu
*Director of the United States Patent and Trademark Office*